(12) United States Patent
Jo

(10) Patent No.: US 7,202,165 B2
(45) Date of Patent: *Apr. 10, 2007

(54) ELECTRONIC DEVICE HAVING A STACKED WIRING LAYER INCLUDING AL AND TI

(75) Inventor: Gyoo Chul Jo, Munkyung-shi (KR)

(73) Assignee: LG.Philips LCD Co., Ltd, Seoul (KR)

( * ) Notice: Subject to any disclaimer, the term of this patent is extended or adjusted under 35 U.S.C. 154(b) by 370 days.

This patent is subject to a terminal disclaimer.

(21) Appl. No.: 09/945,714

(22) Filed: Sep. 5, 2001

(65) Prior Publication Data

US 2002/0045351 A1    Apr. 18, 2002

Related U.S. Application Data

(62) Division of application No. 09/422,983, filed on Oct. 22, 1999, now Pat. No. 6,461,978.

(30) Foreign Application Priority Data

Oct. 23, 1998    (JP) .................................. 10-303057

(51) Int. Cl.
    *H01L 21/44*    (2006.01)
(52) U.S. Cl. ............... 438/669; 257/359; 257/E21.304; 257/E21.414; 438/693; 438/754
(58) Field of Classification Search ................ 257/347, 257/348, 349, 350, 351, 352, 353, 354, 368, 257/382, 383, 741, 750, 763, 764, 765; 438/669
See application file for complete search history.

(56) References Cited

U.S. PATENT DOCUMENTS

| 4,220,706 A | | 9/1980 | Spak |
|---|---|---|---|
| 4,900,398 A | | 2/1990 | Chen |
| 5,010,027 A | * | 4/1991 | Possin et al. |
| 5,102,499 A | | 4/1992 | Jodgens et al. |
| 5,153,754 A | * | 10/1992 | Whetten |

(Continued)

FOREIGN PATENT DOCUMENTS

| DE | 199 28 570 A1 | 12/1999 |
|---|---|---|
| EP | 0 534 240 | 3/1993 |
| JP | 55054573 A | 4/1980 |
| JP | 56029324 A | 3/1981 |
| JP | 06151904 A | 5/1994 |

OTHER PUBLICATIONS

Kelly, J.J. and G.J. Koel. "Galvanic Effects in the Wet-Chemical Etching of Metal Films." *Philips Technical Review* vol. 38, 1978/79, No. 6.

*Primary Examiner*—Andy Huynh
*Assistant Examiner*—Dao H. Nguyen
(74) *Attorney, Agent, or Firm*—McKenna Long & Aldridge LLP

(57) ABSTRACT

In the case that a stacked layer, in which another metal layer is stacked on an Al layer or Al alloy layer having a low resistance, is used as a wiring material, an etchant is provided which can etch to a substantially equal etching rate by executing only one etching on the each metal layer composing the stacked layer. A method of manufacturing a substrate for an electronic device uses the etchant, producing an electronic device having the substrate.

In order to achieve the object, the etchant has fluoric acid, periodic acid and sulfuric acid wherein the total weight ratio of the fluoric acid and periodic acid is 0.05~30 wt %, the weight ratio of the sulfuric acid is 0.05~20 wt %, the weight ratio of periodic acid to fluoric acid is 0.01~2 wt %. Also each layer of wiring (5, 12, 14) formed by stacking Al layer or Al alloy layer and Ti layer or Ti alloy layer can be uniformly etched to substantially equal etching rate by the etchant.

5 Claims, 11 Drawing Sheets

U.S. PATENT DOCUMENTS

| | | |
|---|---|---|
| 5,300,463 A | 4/1994 | Cathey et al. |
| 5,409,569 A | 4/1995 | Seki et al. |
| 5,714,407 A | 2/1998 | Maeno et al. |
| 5,731,856 A * | 3/1998 | Kim et al. .................... 349/43 |
| 5,737,053 A * | 4/1998 | Yomogihara et al. |
| 5,867,242 A * | 2/1999 | Yao et al. |
| 6,081,308 A * | 6/2000 | Jeong et al. |
| 6,140,233 A | 10/2000 | Kwag et al. ................ 438/669 |
| 6,232,228 B1 | 5/2001 | Kwag et al. |
| 6,369,410 B1 * | 4/2002 | Yamazaki et al. |
| 6,461,978 B1 * | 10/2002 | Jo ............................... 438/754 |
| 2005/0127447 A1 * | 6/2005 | Jo ............................... 257/359 |

* cited by examiner

A

B

US 7,202,165 B2

ELECTRONIC DEVICE HAVING A STACKED WIRING LAYER INCLUDING AL AND TI

This application is a divisional of Ser. No. 09/422,983, filed Oct. 22, 1999, now U.S. Pat. No. 6,461,978. This application claims the benefit of Japanese Patent Application No. 1998-303057, filed on Oct. 23, 1998, which is hereby incorporated by reference for all purposes as if fully set forth herein.

BACKGROUND OF THE INVENTION

The present invention relates to an etchant, a method of manufacturing a substrate for electronic device by using an etchant, and an electronic device having the substrate, and especially an etchant in which each layer of wiring formed by stacking an Al layer, or Al alloy layer, and a Ti layer, or Ti alloy layer, can be uniformly etched to a substantially equal etching rate by the etchant.

Al as a wiring material has an advantage of having low resistance, and it is frequently used as the wiring material of an electrode etc. on a substrate of an electronic device.

As an example of the electronic device, FIG. 12 is a plan view showing a thin film transistor in a conventional thin film transistor LCD.

The thin film transistor 82 comprises a gate electrode 84 formed on a substrate 83 and a gate insulating layer 85 to cover the gate electrode 84. A semiconductor active layer 86 of an amorphous silicon (hereinafter, "a-Si") is formed on the gate insulating layer 85 of the upper gate electrode 84. And a source electrode 88 and a drain electrode 89 are extended on the gate insulating layer 85 or semiconductor active layer 86 wherein ohmic contact layer 87 composed of amorphous silicon having n-type impurity like phosphorus (P) (hereinafter, "n+ a-Si") is inserted. Also a passivation layer 90 covering a thin film transistor 82 made up of the source electrode 88, the drain electrode 89, and the gate electrode 84 is formed, and a contact hole 91 is formed on the passivation layer 90 of the drain electrode 89. Further a pixel electrode 92 constituted by a transparent electrode layer of indium tin oxide (hereinafter, "ITO") electrically connected with the drain electrode 89 through the contact hole 91 is formed.

And the left part of FIG. 12 shows a sectional view of a gate terminal pad 93 of the gate wiring. A contact hole 95 passing through a gate insulating layer 85 and a passivation layer 90 is formed on the lower pad layer 94 composed of gate wiring material on the substrate 83, and a upper pad layer 96 constituted by a transparent electrode layer is electrically connected with a lower pad layer 94 through the contact hole 95. Also a source wiring is of similar structure to the gate wiring.

As mentioned hereto, for example, in the thin film transistor, the transparent electrode layer constituting a gate terminal, a source terminal and a pixel electrode is directly connected with a metal for wiring constituting the gate wiring, the source wiring and the drain electrode.

By the way, in the case of using the Al metal layer as a wiring material in order to reduce the wiring resistance in the electronic device, a hillock is generated. The hillock is generated as a needle-shaped projection on the surface of the Al layer during a heat treatment. The projection is passed through the stacked insulating layer so that a short circuit is generated with another conducting layer, or a poor insulation occurs. Also if the ITO were directly contacted with the Al, oxygen of the ITO should oxidize the Al, as a result, the electric resistance of contact part should be increased.

In order to prevent the above problem, a stacked layer, produced by forming another metal layer like Mo layer or Cr layer on the Al layer (hereinafter, "different metal stacked layer"), has been widely used. In the case of providing a gate electrode 84 in a stacked layer of the different metal from each other, for example, as shown in FIG. 14A, a photomask 97 of a desired pattern is formed on the surface of stacked layer 84c stacking an Mo layer 84b on the Al layer 84a formed on the substrate 83 by photolithography. And then, the stacked layer 84c is obtained from uniform etching by using an etchant having $H_3PO_4$ of 80 wt %, $HNO_3$, $CH_3COOH$ and $H_2O$.

By the way, in the case that it is patterned by uniform etching of the different metal stacked layer, a battery reaction of the etchant is generated by the potential difference between the metal layers, and an under-cut is generated, in which a line width of the Al layer 84a in the lower layer is shorter than a line width of the Mo layer 84b in the upper layer as shown in FIG. 14B, because the Al layer in the lower layer is more quickly etched than the Mo layer in the upper layer. Also a problem of poor insulation enduring press may be generated.

Therefore, in order to solve these problems, after the uniform etching, sunscreen-shaped Mo layer 84b can be patterned by added etching by using an uric acid.

SUMMARY OF THE INVENTION

By the way, in the conventional method of manufacturing a substrate for an electronic device which is provided with the different metal stacked layer, the yield will be bad, the manufacturing process will be lengthened, and the cost will rise because at least two etching processes are needed. Further if adding etching were executed as mentioned above, the Mo layer in the upper layer should be a little more quickly etched than the Al layer in the lower layer, and as a result, as shown in FIG. 14C, the Al layer in the lower layer would be projected, and it is difficult to control a line width of wiring in the upper and lower layers.

Also, another method of forming a gate electrode in the different metal stacked layer, as shown in FIG. 15A, comprises the steps of: providing an Al layer 84a on the substrate 83; coating photoresist 97 on the surface of Al layer 84a; executing photolithography; and etching, as shown in FIG. 15B, so that an Al layer 84a of a desired line width is obtained. Subsequently the method comprises the steps of: covering the Al layer 84a by a Mo layer 84b, as shown in FIG. 15C; forming by photolithography a photo-mask 98 of a desired pattern, as shown in FIG. 15D; and then etching. By the way, at least a double etching process is needed like the conventional method, so that a problem is generated in this method, also. And the stacked wiring has a structure in which the Al layer 84a in the lower layer is covered with an Mo layer 84b in the upper layer, as shown in FIG. 15E, so that the line width in the upper layer is necessarily larger than the line width in the lower layer. As a result it is difficult to control the line width of wiring in the upper layer and lower layer.

The present invention is constituted with regard to the problems outlined above. In forming a stacked layer (formed by stacking a different metal layer on an Al layer, or Al alloy layer, having a lower resistance, as a wiring material), the present invention provides: an etchant which can etch with a substantially equal etching rate, by etching only one time, each metal layer of the stacked layer; a method of manufacturing a substrate for an electronic device by using the etchant; and an electronic device having the substrate.

DETAILED DESCRIPTION OF THE PREFERRED EMBODIMENTS

When an accumulated layer, formed by stacking with a different metal layer with an Al layer, or Al alloy layer, is used as a wiring material, generation of under-cut can be decreased substantially by etching only one time, and using an etchant wherein each metal layer is etched at a substantially equal etching rate—above all, when each metal layer composing a different metal stacked layer functions as the electrode in electrolyte with the regard to the electrode potential. As a result of repeated examinations and experimentation, it is determined that if another metal layer composing the stacked layer has a small electric potential, as compared against an Al or Al alloy layer, the difference of etching rate should be small. Especially if the stacked layer is formed by stacking an Al layer, of Al alloy layer, and a Ti layer, or Ti alloy layer, by turns is used as a wiring material, generation of under-cut could be decreased and uniform etching could be executed.

The result is attended with following embodiments.

Figure 4:
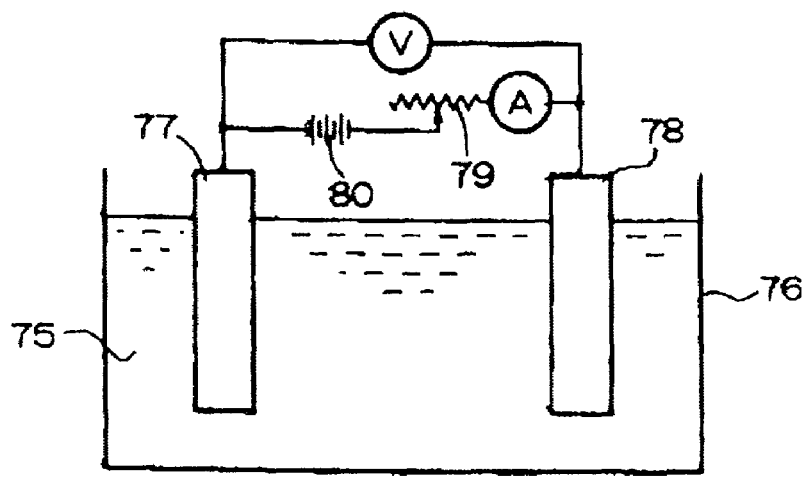
FIG. 4 is a view showing a structure of a electrode-electric potential measuring instrument.
Figure 5:
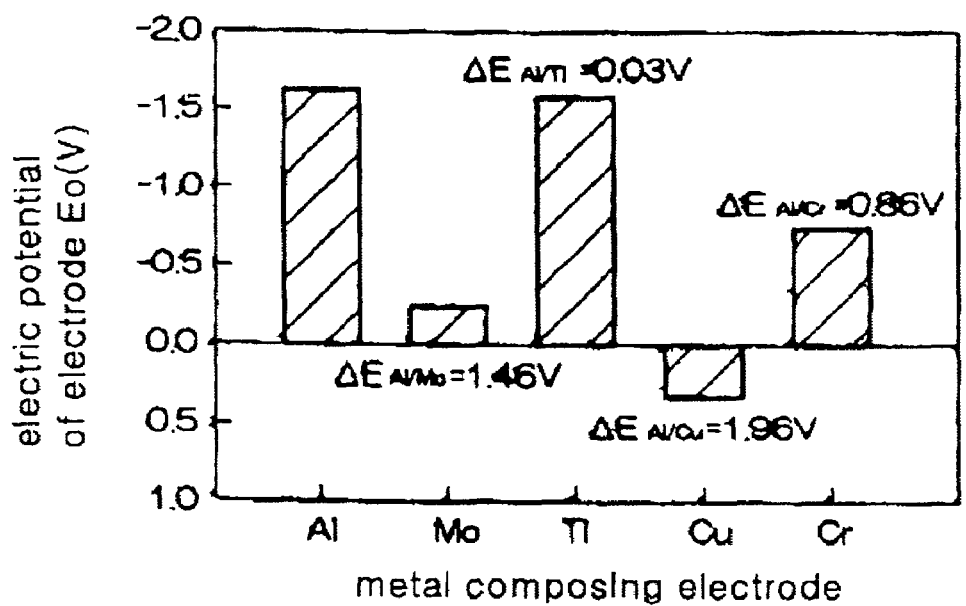
FIG. 5 is a graph showing the relation between electrode-electric potential and metal composing a electrode.

FIG. 4 is view showing an electrode-electric potential measuring instrument. The instrument comprises: a container 76 filled with an electrolyte 75; a standard hydrogen electrode (hereinafter, "SHE") as a part of electrode, and a sample made up of various metal (Al, Mo, Ti, Cu, Cr) as the other part of electrode 78; and a source 80 connected by inserting a variable resistor 79 to both electrodes 77,78. A method of measuring the potential difference between both electrodes 77,78 by the electrode-electric potential measuring instrument comprises the steps of: filling an electrolyte 75 in a container 76; immersing SHE 77 and sample 78 in the electrolyte 75; supplying a voltage by source 80 so that a current is sent; and measuring an electrode potential ($E_0$) between both electrodes 77, 78. The electrolyte 75 filled in the container depends on the metal a sample consists of. If the sample is Al, $H_2SO_4$ should be used as electrolyte; for MO, the electrolyte is HCl or NaOH; for Ti, the electrolyte is HCl and Cu is $H_2So_4$. If the sample were Cr, HCl should be used as an electrolyte. The electrode potential ($E_0$) is measured when a variable resistor is controlled so as to become 0A current. FIG. 5 is view showing the result. Also $\Delta E$ represents an electrode potential difference between an electrode potential of a sample made up of Al, and that of a sample made of another metal. According to results shown in FIG. 5, in the case of using a sample made up of Al ($E_0$=−1.66V), the sample of a small potential difference between electrodes is a sample made up of Ti ($E_0$=−1.63), at that time, $\Delta E$ is 0.03V.

By the way, stacked wiring that uses the stacked layer (hereinafter, "stacked layer of Al and Ti") formed by stacking with Al layer, or Al alloy layer, and Ti layer, or Ti alloy layer, by turns is not practical, and in the case that each metal layer of this stacked wiring is uniformly etched by using the etchant of the substantially equal etching rate, after reducing the generation of under-cut, but this etchant is not practical too. Also the one time etching method of the stacked layer is not settled. Therefore, in order to verify the said result and to realize the practical use, more time is needed.

Further, as a result of various examinations and experiments, the present invention is shown in the following facts: if an etchant composed of fluoric acid, periodic acid and sulfuric acid were used, each metal layer composing a stacked layer of Al and Ti can be etched at the same time. And when the Al electrode and Ti electrode is immersed in etchant according to the experiment, the potential difference between electrodes ($\Delta E$) becomes smaller. When the stacked layer of Al and Ti is uniformly etched, the side etching amount of Al layer ($\Delta L$) becomes smaller, and especially if an etchant wherein the potential difference between electrodes ($\Delta E$) is 400 mV and less were used, the under-cut can be reduced without a problem for practical use ($\Delta L$ is 500 Å and less). Also the potential difference between electrodes can be changed by controlling the compound amount of each element composing the etchant. The reason is explained by referring to following Nernst expression (1), $$E = E_0 + [(RT/nF)*ln(\sigma)] \qquad (1)$$

(in the expression, E is the potential difference, $E_0$ is standard electrode potential, T is absolute temperature, n is electron number, F is Faraday constant and $\sigma$ is an ion activity in a solution.)

$\sigma$ depends on component and compound rate of etchant so that the potential difference E can be changed.

Figure 6:
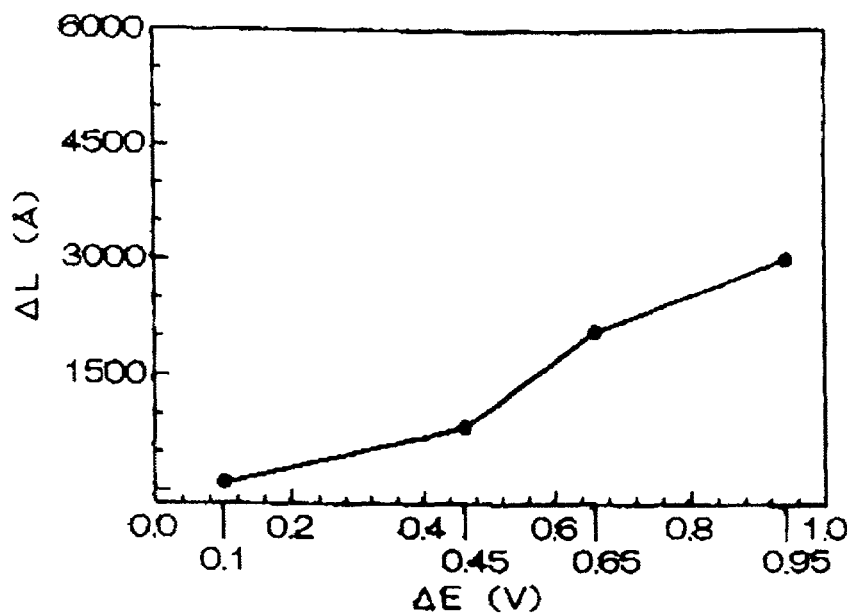
FIG. 6 is a graph showing the relation between a side etching amount of stacked layers of Al and Ti, ($\Delta L$), and the potential difference between the Al electrode and Ti electrode, ($\Delta E$).

FIG. 6 is a view showing the relation between the potential difference (ΔE) between the Al electrode and the Ti electrode, and the side etching amount of a stacked layer of Al or Ti. At this time, the side etching amount (ΔL) is, when the stacked layer is formed by stacking an Al layer $3a$ of 1300 Å and Ti layer $4a$ of 500 Å in order on the substrate $2a$, and is etched by an etchant of HF, HIO$_4$ and H$_2$SO$_4$, a distance from the four sides of the Ti layer to the four sides sunk deeply of the Ti layer. When the potential difference (ΔE) is 0.1V in FIG. 6, each element rate of etchant is the same as follows—HF is 0.3 wt %, HIO$_4$ is 0.5 wt % and H$_2$SO$_4$ is 0.5 mol/l (2.7 wt %). In the case that ΔE is 0.45V, HF is 0.25 wt %, HIO$_4$ is 0.5 wt % and H$_2$SO$_4$ is 0.3 mol/l (1.6 wt %). If ΔE were 0.65V, HF is 0.5 wt %, HIO$_4$ is 1 wt %, H$_2$SO$_4$ is 0.5 mol/l (2.7 wt %); if ΔE were 0.95V, HF is 0.3 wt %, HIO$_4$ is 1.0 wt % and H$_2$SO$_4$ is 0.5 mol/l (2.7 wt %).

And when the etchant is composed of fluoric acid, periodic acid and sulfuric acid, a compound amount of each element is prescribed within a special range so that the potential difference between the Al electrode and the Ti electrode (ΔE) is 400 mV or less, and the problems can be solved.

In order to solve the problem, an etchant according to the present invention possesses fluoric acid, periodic acid and sulfuric acid wherein the total weight ratio of fluoric acid and periodic acid is 0.05–30 wt %, the weight ratio of the sulfuric acid is 0.05–20 wt %, the weight ratio of periodic acid to fluoric acid is 0.01–2 wt %. Also each wiring layer formed by stacking an Al layer, or Al alloy layer, and a Ti layer, or Ti alloy layer, can be uniformly etched with a substantially equal etching rate by the etchant.

If the total weight ratio of fluoric acid and periodic acid were under 0.05 wt %, the etching rate should be extremely slow, and if it exceeded 30 wt %, the etchant rate should become too fast so that it is difficult to control.

If the weight rate of sulfuric acid were under 0.05 wt %, then the potential difference (ΔE) should exceed 400 mV, and when the stacked layer of Al layer, or Al alloy layer, and Ti layer, or Ti alloy layer, were uniformly etched, a big undercut should be generated and the insulating press-resistance defect might be generated. If it is excessively added above 20 wt %, the effect is not increased and the rate of fluoric acid and periodic acid will be decreased, and the distribution of etching states within the layers will be deteriorated.

If the weight ratio of periodic acid to fluoric acid were under 0.01, the potential difference (ΔE) should exceed 400 mV. Also, if the weight ratio exceeded 2, the potential difference (ΔE) should exceed 400 mV, and when the stacked layer is uniformly etched, a big under-cut will be generated. Also an insulating press-resistance defect may be generated.

An etchant according to the present invention includes fluoric acid, periodic acid and sulfuric acid, and each metal layer having a stacked layer formed by stacking with Al layer, or Al alloy layer, and Ti layer or Ti alloy layer, by turns, or a stacked layer formed by stacking with Ti layer or Ti alloy layer, Al layer or Al alloy layer, and Ti layer or Ti alloy layer by turns can be etched at the same time.

Also according to an etchant of the present invention, in the case that the total weight ratio of fluoric acid and periodic acid is 0.05–30 wt %, the weight ratio of sulfuric acid is 0.05–20 wt %, the weight ratio of periodic acid to fluoric acid is 0.01–2 wt %, each metal layer including a stacked layer of Ti layer or Ti alloy layer as another metal layer stacked on Al layer or Al alloy layer having a low resistance can be etched to substantially an equal etching rate by only etching one time.

Further, in order to solve the problem, in a method of manufacturing a substrate for an electronic device according to the present invention, a surface of a stacked layer formed by stacking with an Al layer or Al alloy layer and a Ti layer or Ti alloy layer (hereinafter, "stacked layer of Al and Ti") on the insulating substrate at least by turns has a mask of a desired pattern, and the stacked layer is etched by using the etchant so that the stacked wiring of the desired pattern is formed.

And, in order to solve the problem, in a method of manufacturing a substrate for electronic device according to the present invention, a surface of a stacked layer formed by stacking with a Ti layer or Ti alloy layer, Al layer or Al alloy layer and Ti layer or Ti alloy layer (hereinafter, "stacked layer of Al and Ti") on the insulating substrate at least by turns has a mask of a desired pattern, and the stacked layer is etched by using the etchant so that the stacked wiring of a desired pattern is formed.

In a method of manufacturing a substrate for electronic device according to the present invention, each metal layer including the stacked layer could be etched to substantially equal etching rate by only one time etching because the stacked layer is etched by using the etchant of the structure, so that it is easy to control line width of wiring in the upper layer and the lower layer including stacked wiring layer, the yield is good, and the manufacturing process cost can be reduced. And each metal layer including the stacked layer could be etched to nearly equal etching rate of only one time, so that it is easy to control the line width of wiring in the upper layer and the lower layer including the stacked wiring layer. Also, because of using the stacked layer formed by stacking with a Ti layer or Ti alloy layer on an Al layer or Al alloy layer, it produces a structure of a barrier layer on the surface of Al layer or Al alloy layer and a hillock generated by the following heat treatment is restrained so that a short or insulating defect generated from a hillock can be prevented. Further the contact resistance between a Ti layer or Ti alloy layer and ITO is smaller than the contact resistance between an Al layer or Al alloy layer and ITO, so that contact resistance can be decreased by forming a Ti layer or Ti alloy layer on the surface of the Al layer or Al alloy layer.

Therefore, according to a method of manufacturing a substrate for an electronic device, the electric property is good and the substrate for an electric device of low cost can be obtained by an improvement of yield.

An electronic device of the present invention has the substrate for electronic device using stacked wiring layer having a Al layer or Al alloy layer with a low wiring resistance, so that a voltage drop of a signal caused by wiring resistance or wiring delay is difficult to be generated, and a most suitable display device of a wide-screen display, in which wiring is lengthened, or a high definition display, in which wiring becomes thin, can be easily realized.

(Embodiment of the Present Invention)

Hereinafter, the present invention will be described in detail referring to the drawings, but the present invention is not limited by the embodiments described herein.

Figure 3:
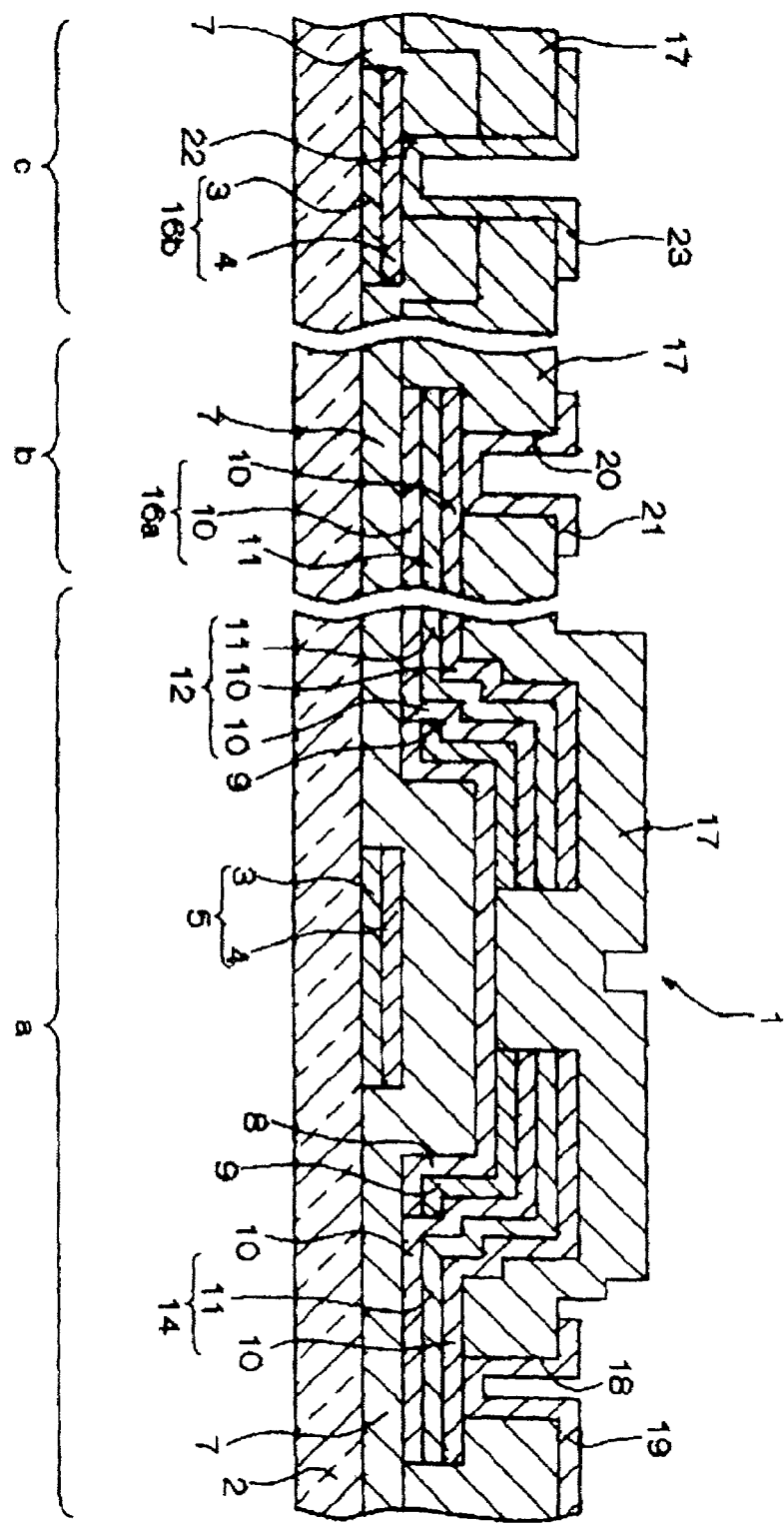
FIG. 3 is a sectional view showing a part of a substrate in a thin film transistor obtained by a method of manufacturing a substrate for an electronic device, according to the present invention.

FIG. 3 is a sectional view showing an embodiment of a thin film transistor by applying the method of manufacturing a substrate for an electronic device to a method of manufacturing a thin film transistor substrate provided in the liquid crystal display device.

Symbol "a" represents a thin film transistor(TFT), "b" is a terminal of source wiring installed to the outside of TFT matrix and "c" is a terminal of gate wiring. The three parts are distant from the real liquid crystal display device having this thin film transistor 1, and real sectional view is not shown at the same time but it is illustrated near to each other for convenience.

First of all, thin film transistor a will be explained.

Gate electrode 5 as the stacked wiring layer having an Al layer or Al alloy layer 3 of 1300~2000 Å thickness and a Ti layer or Ti alloy layer of 500~1000 Å thickness is provided on the substrate 2. Gate insulating layer 7 is formed on the gate electrode and semiconductor layer 8 of an amorphous silicon (a--Si) is provided on the gate insulating layer 7 and an $n^+$ a--Si layer 9 is formed on the semiconductor layer 8. And a source electrode 12 and a drain electrode 14 is formed on the $n^+$ a--Si layer. The source electrode 12 and the drain electrode 14 includes the stacked wiring layer formed by stacking with Ti layer or Ti alloy layer 10 of 500~1000 Å thickness, Al layer or Al alloy layer 11 of 1300~2000 Å thickness, also Ti layer or Ti alloy layer 10 of 500~1000 Å thickness.

Also, a passivation layer 17 covering the source electrode 12 or the drain electrode 14 is provided on the source electrode or the drain electrode, and contact hole 18 coming to Ti layer or Ti alloy layer 10 on the Al layer or Al alloy layer 11 is formed on the passivation layer 17. And an ITO layer 19 is formed as a pixel electrode passing through inner wall and the bottom of the contact hole 18. The drain electrode 14 is electrically connected with the ITO layer 19 (pixel electrode) through the contact hole 18.

Next, terminal part "b" of source wiring comprises: a lower pad layer 16a composed of the Ti layer or Ti alloy layer 10, Al layer or Al alloy layer 11 and Ti layer or Ti alloy layer 10 on the gate insulating layer 7; passivation layer 17 provided on the lower pad layer; contact hole 20 coming to Ti layer or Ti alloy layer 10 on Al layer or Al alloy layer 11; and upper pad layer 21 composed of the ITO passing through the inner wall and the bottom of the contact hole 20. The upper pad layer 21 and the lower pad layer 16a is electrically connected through the contact hole 20.

Then terminal part "c" of gate wiring comprises: lower pad layer 16b constituted by stacked wiring layer of Al layer or Al alloy layer 3 and Ti layer or Ti alloy layer 4 on the substrate 2; gate insulating layer 7 provided on the lower pad layer; passivation layer 17 provided on the gate insulating layer; contact hole 22 coming to Ti layer or Ti alloy layer 4; and upper pad layer 23 composed of the ITO passing through inner wall and the bottom of the contact hole 22. The upper pad layer 23 and the lower pad layer 16b is electrically connected through the contact hole 22.

By this constitution, an ITO layer and an Al layer are connected by inserting a Ti layer or Ti alloy layer composed of metal connected electrically with the ITO, so that a resistance increase, generated from direct connection to each other, can be prevented.

A (amorphous) —$SiN_x$:H, a—$SiN_x$, a—$SiO_2$:H $SiO_2$ can be used as the passivation layer.

Figure 1:
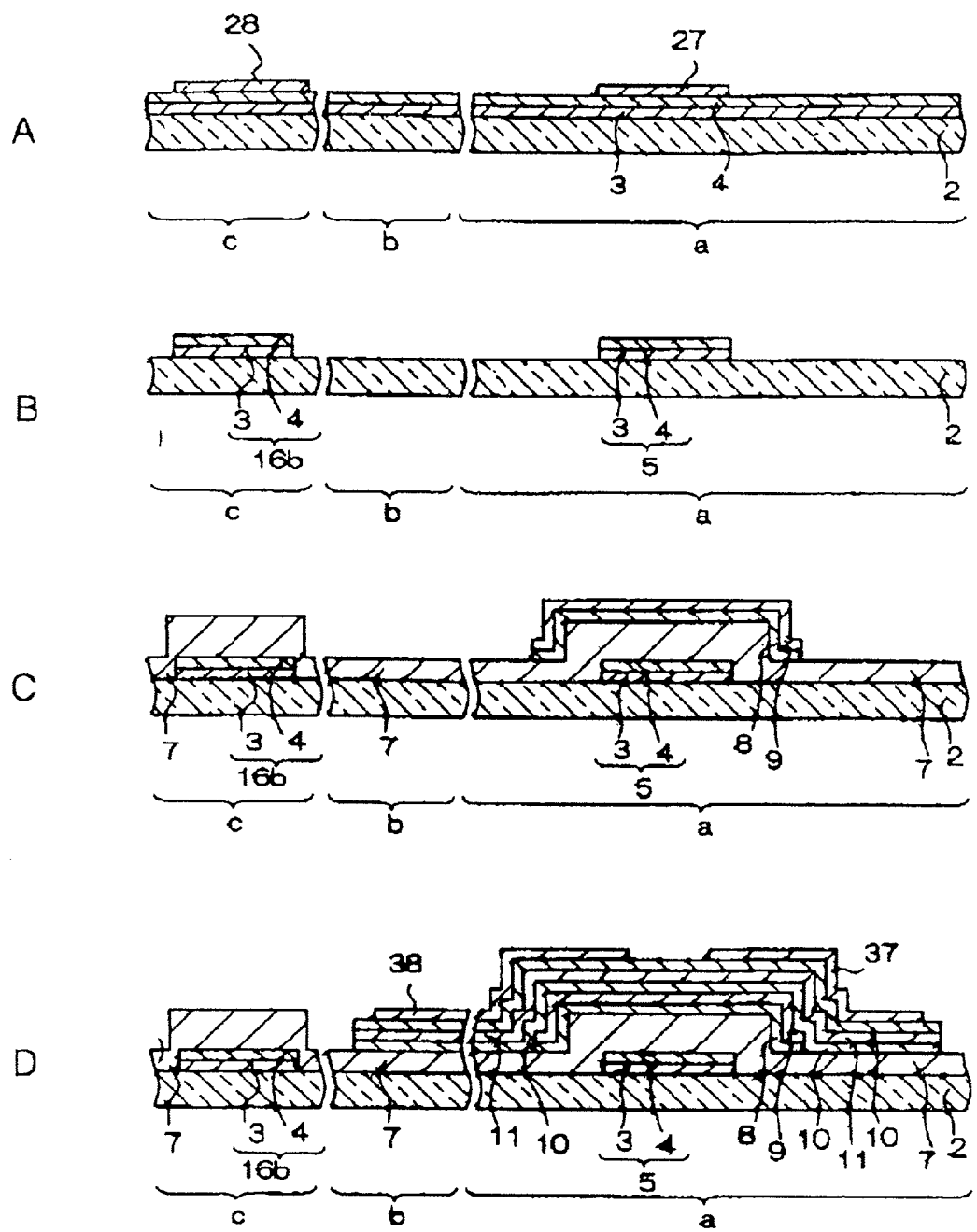
FIG. 1 is a plan view showing a method of manufacturing a substrate of a thin film transistor, in an embodiment related to a method of manufacturing a substrate for an electronic device, according to the present invention.
Figure 2:
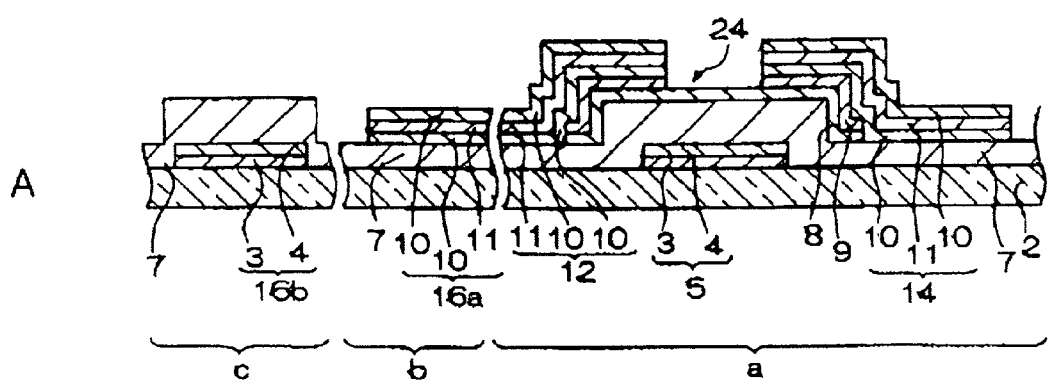
FIG. 2 is a plan view showing a method of manufacturing a substrate of a thin film transistor, in an embodiment related to a method of manufacturing a substrate for an electronic device, according to the present invention.
Figure 2:
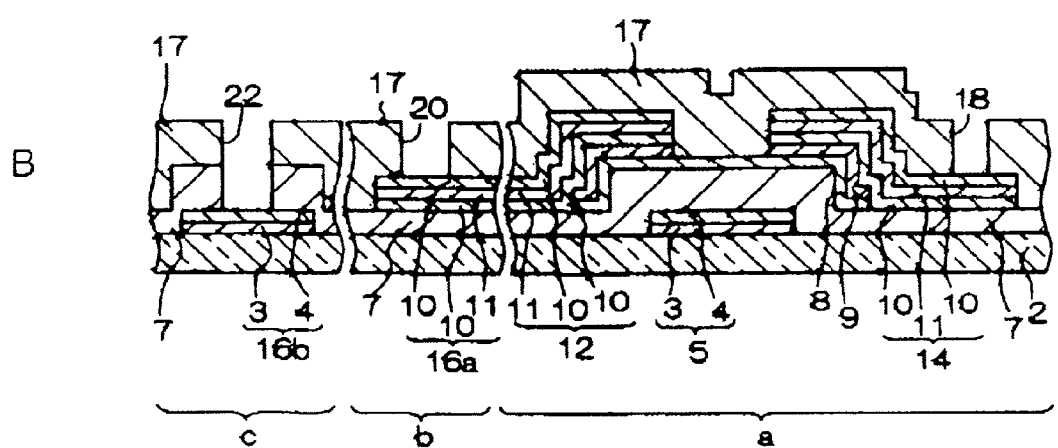

Hereinafter, a method of manufacturing a thin film transistor substrate 1 according to the present invention is described referring to FIG. 1 and FIG. 2. In FIG. 1 and FIG. 2, symbol "a" represents a thin film transistor(TFT) part, "b" is a terminal of source wiring laid to the outside of TFT matrix and "c" is a terminal of gate wiring.

Firstly, as shown in FIG. 1A, a stacked layer is formed by stacking with the Al layer or Al alloy layer 3 and a Ti layer or Ti alloy layer 4 by turns by sputtering over the substrate 2.

Secondly, in the thin film transistor part 1, photomask 27 of desired pattern is provided on Ti layer or Ti alloy layer 4 by photolithography and then uniform etching is executed on the stacked layer by using an etchant composed of fluoric acid, periodic acid and sulfuric acid, and as shown in FIG. 1B, gate electrode 5 composed of a stacked wiring layer of Al layer or Al alloy layer 3 and a Ti layer or Ti alloy layer 4 is provided. The etchant is controlled so that the total weight ratio of the fluoric acid and periodic acid is 0.05–30 wt %, the weight ratio of sulfuric acid is 0.05–20 wt %, the weight ratio periodic acid to fluoric acid is 0.01–2 wt %.

In the terminal part of gate wiring "c," photomask 28 of desired pattern is provided on the Ti layer or Ti alloy layer 4 by photolithography and then uniform etching is executed on the accumulated layer by using the etchant, as shown in FIG. 1B, so that the lower pad layer 16b composed of stacked wiring layer of an Al layer or Al alloy layer 3 and a Ti layer or Ti alloy layer 4 is provided.

As a result of this, an Al layer or Al alloy layer 3 and a Ti layer or Ti alloy layer 4 including the stacked layer are etched by a substantially equal etching rate at the same time, and gate electrode 5 and the lower pad layer 16b, wherein the wiring width of the upper layer and the lower layer have an equal stacked wiring layer, so that insulating press-resistance defect causing to under-cut can be prevented.

Next, gate insulating layer 7 is generated all over the substrate 2 by a CVD method. And in the thin film transistor part "a," semiconductor layer 8 and $n^+$ a-Si layer 9 are formed and then, as shown in FIG. 1C, semiconductor layer 8 and $n^+$ a-Si layer 9 are etched, except the upside of the gate electrode 5 of the TFT channel part.

And, in the thin film transistor part "a" and the terminal part of source wiring "b," as shown in FIG. 1D, a stacked layer is formed by stacking with a Ti layer or Ti alloy layer, an Al layer or Al alloy layer, and a Ti layer or Ti alloy layer by turns.

In the thin film transistor part "a," photomask 37 of a desired pattern is provided on the Ti layer or Ti alloy layer 10 of upside of gate electrode 5 that is TFT channel part, by photolithography, and then uniform etching is executed on the stacked layer by using the etchant, as shown in FIG. 2A, such that the source electrode 12 and the drain electrode 14, including a stacked wiring layer of a Ti layer or Ti alloy layer 10, an Al layer or Al alloy layer 11, and a Ti layer or Ti alloy layer 10 is formed.

In the terminal part of source wiring "b," a photomask 38 of a desired pattern is provided on the Ti layer or Ti alloy layer 10 by photolithography, and then uniform etching is executed on the stacked layer by using the etchant, so that as shown in FIG. 2A, lower pad layer 16, a including a stacked wiring layer of a Ti layer or Ti alloy layer 10, an Al layer or Al alloy-layer 11, and a Ti layer or Ti alloy layer 10 is formed.

As a result of this, Ti layer or Ti alloy layer 10, Al layer or Al alloy layer 3, and Ti layer or Ti alloy layer 4 including the stacked layer can be etched by a substantially equal etching rate at the same time, and the source electrode 12, the drain electrode 14 and lower pad layer 16a, wherein wiring the width in the middle of the upper layer and the lower layer having an equal stacked wiring layer can be obtained, so that an insulating press-resistance defect causing an under-cut can be prevented.

Hereinafter, channel 24 is formed by etching the $n^+$ a-Si layer 9 using dry etch or both dry etch and wet etch.

And in the thin film transistor part "a," the terminal part of source wiring "b" and the terminal part of gate wiring "c" a passivation layer 17 is provided on the Ti layer or Ti alloy layer 4, 10.

Next, in the thin film transistor part "a" as shown in FIG. 2B, contact hole 18 is generated by etching the passivation layer 17 using dry etch or both dry etch and wet etch, an ITO layer is provided over the substrate and then patterning is executed, as shown in FIG. 3, such that ITO layer 19 is formed over the bottom of contact hole 18, the inner surface and upside of the passivation layer 17.

Also in the terminal part of source wiring "b" and the terminal part of gate wiring "c," contact hole 20,22 is generated by etching the passivation layer 17, using dry etch or both dry etch and wet etch only, contact hole 22 is formed by etching on both the passivation layer 17 and the gate insulating layer 7 in the terminal part of gate wiring "c" and then, ITO is formed over the substrate and patterning is executed, as shown in FIG. 3, so that upper pad layers 21,23 are formed coming to the bottom of contact hole 20,23, inner surface and upside of the passivation layer 17.

The thin film transistor substrate can be manufactured by this order.

In a method of manufacturing thin film transistor substrate according to the present embodiment, each metal layer composing the stacked layer could be etched to a substantially equal etching rate by only one time etching so that it is easy to control the wiring width of upper layer and lower layer composing the stacked wiring layer, the yield is good and the manufacturing process cost can be reduced.

Also, because of using the stacked layer by stacking with a Ti layer or Ti alloy layer on an Al layer or Al alloy layer, a barrier layer is formed on the surface of Al layer or Al alloy layer and a hillock generated by the following heat treatment is restrained so that a short or an insulating defect generated from the hillock can be prevented.

Further, because a Ti layer or Ti alloy layer formed on Al layer or Al alloy layer is connected to the ITO layer, the Al layer or Al alloy layer can be electrically connected to ITO layer without increasing the contact resistance.

As a result, the thin film transistor substrate 1 produced according to a method of manufacturing of the present invention has a good electric property and can reduce the cost by increasing of yield.

The technical range of the present invention is not limited to the details of the described embodiments, for example, the layer thickness of the Al layer or Al alloy layer, the Ti layer or Ti alloy layer and the passivation layer, and the shape can be changed within the scope of the present invention.

The embodiment describes the case that the gate electrode and the lower pad layer 16b is provided by etching uniformly stacked layer formed by stacking with an Al layer or Al alloy layer 3 and a Ti layer or Ti alloy layer 4, but can also be provided by etching uniformly a stacked layer formed by stacking with a Ti layer or Ti alloy layer, an Al layer or Al alloy layer and a Ti layer or Ti alloy layer. And the embodiment describes the case that the source electrode 12, the drain electrode 14 and the lower pad layer 16a is provided by etching uniformly a stacked layer formed by stacking with a Ti layer or Ti alloy layer 10, an Al layer or Al alloy layer 11, and a Ti layer or Ti alloy layer 10, but can also be provided by etching uniformly a stacked layer formed by stacking with an Al layer or Al alloy layer 3 and a Ti layer or Ti alloy layer 4.

Figure 7:
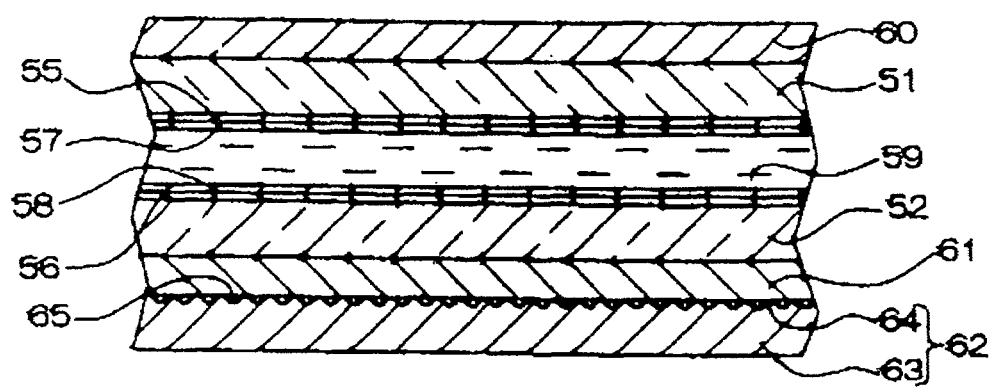
FIG. 7 is a plan view showing an example of a reflective-type liquid crystal display device using a substrate of a thin film transistor according to the present invention.

FIG. 7 is a plan view showing an example of a reflective-type liquid crystal display device using a substrate of a thin film transistor according to a method of manufacturing a substrate for an electronic device of the present invention.

The reflective-type liquid crystal display device has an upper transparent electrode layer 55 and an upper alignment layer 57 by turns on the inner surface of an upper substrate 51, and a lower transparent electrode layer 56 and a lower alignment layer 58 by turns on the inner surface of the lower substrate 52 in the upper and lower substrates 51,52 having a liquid crystal layer and facing each other.

The liquid crystal 59 is provided between the upper and lower alignment layers 57,58. Upper polarizer 60 is provided on the outside of the upper substrate 51, lower polarizer 61 is provided on the outside of the lower substrate 52 and a reflective plate 62 is provided on the outside of the lower polarizer 61 wherein an uneven layer 65 is formed toward the lower polarizer 61. The reflective plate 62, an example, has a metal-reflective layer 64 of Al or Ag on the uneven layer composed of polyester film 63 having uneven face on the surface and uneven layer 65 on the surface.

In the reflective-type liquid crystal display device, the substrate 52 is the substrate 2 of the thin film transistor 1 according to a method of manufacturing an electronic device of the present invention, and the lower transparent electrode layer 56 is the ITO layer (pixel electrode) 19.

A reflective-type liquid crystal display device of the present invention has the thin film transistor substrate 1 using a stacked wiring layer having an Al layer or Al alloy layer as a low resistance wiring, so that the volt drop of a signal caused by wiring resistance or wiring delay is not generated, and a most suitable display device of a wide-screen display, in which wiring is lengthened, or a high definition display, in which wiring becomes thin, can be easily realized.

EMBODIMENT

Hereinafter, the present invention is described in detail referring to embodiments, but the present invention is not limited to the embodiments described herein.

(Embodiment 1)

The relation between the $HIO_4$ content of an etchant, and the potential difference between the Al electrode and the Ti electrode is investigated by using the electrode-electric potential measuring instrument as follows.

Etchant is filled in a container, an Al electrode and a Ti electrode are immersed in the etchant as both electrodes, a voltage is applied by a source, and then the potential difference between both electrodes is measured. HF of 0.3 wt %, $H_2SO_4$ of 0.1 mol/l (0.54 wt %) is used as the etchant, and $HIO_4$ has range of 0.05 wt %~2.0 wt %. The result is shown in FIG. 8.

Figure 8:
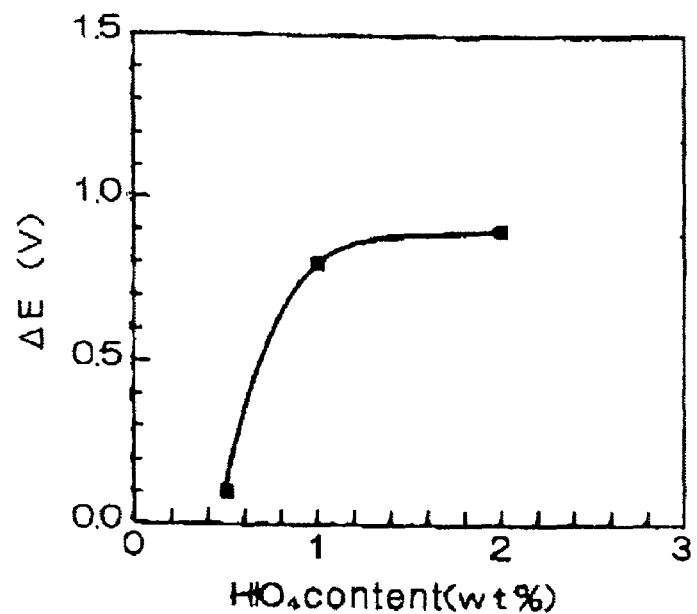
FIG. 8 is a graph showing the relation between the potential difference between an Al electrode and a Ti electrode, and the $HIO_4$ content of an etchant.

In the result shown in FIG. 8, in the case that the HF content of the etchant is 0.3 wt % and the $H_2SO_4$ content is 0.1 mol/l, if the $HIO_4$ content is 0.6 wt % or less, the potential difference between the Al electrode and the Ti electrode ($\Delta E$) should be 0.4V or less. In the case of having the potential difference ($\Delta E$) of 0.4V, the weight ratio of $HIO_4$ to HF is 2 or less so that the weight ratio of $HIO_4$ to HF has a limit 2.

(Embodiment 2)

The relationship between the HF content of the etchant and the potential difference between the Al electrode and the Ti electrode, and side etching amount ($\Delta L$) when a stacked layer of the Al layer and Ti layer is etched by using the etchant, is investigated as follows.

In the HF content of the etchant and the potential difference between the Al electrode and the Ti electrode, embodiment 2 is same as embodiment 1 except that the $HIO_4$ content of the etchant is 1.5 wt %, $H_2SO_4$ is 1 mol/l (5.4 wt %) and HF is 0.1 wt %~0.8 wt %. The result is shown in FIG. 9.

And, the side etching amount is measured when a stacked layer formed from an Al layer having a thickness of 1300 Å and a Ti layer having a thickness of 500 Å is uniformly etched by using the etchant.

Figure 10:
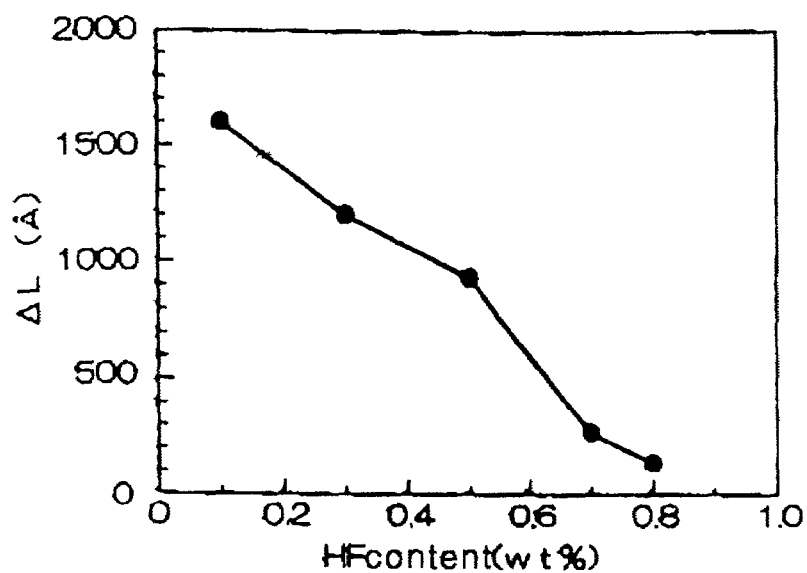
FIG. 10 is a graph showing the relation between HF content of an etching material, and a side etching amount when stacked layers of an Al layer and a Ti layer are etched by the etchant.

The result is shown in FIG. 10.

Figure 9:
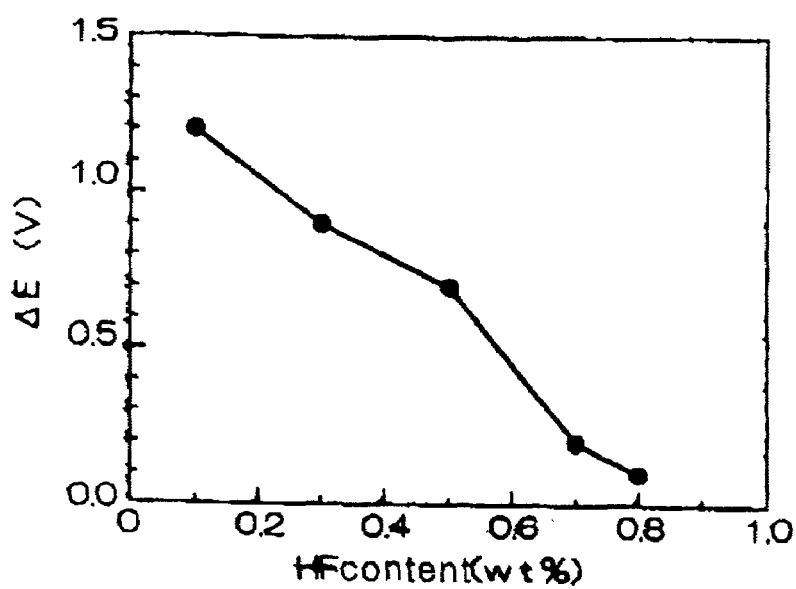
FIG. 9 is a graph showing the relation between the potential difference between an Al electrode and a Ti electrode, and the HF content of an etchant.

In the results shown in FIG. 9 and FIG. 10, in the case that the $HIO_4$ content of the etchant is 1.5 wt %, and $H_2SO_4$ is 1 mol/l, if the HF content is 0.65 wt % or more, the potential difference between the Al electrode and the Ti electrode ($\Delta E$) should be 0.4V and less. Also the side etching amount ($\Delta L$) is 500 Å or less, and it doesn't have a problem for practical use. Especially, in the case that the HF content is 0.75 wt % or more, the side etching amount ($\Delta L$) becomes 250 Å and less.

(Embodiment 3)

Embodiment 3 is same as embodiment 1 except that the $HIO_4$ content of the etchant is 0.05 wt %, HF is 0.03 wt % and $H_2SO_4$ is 0 wt %~0.54 wt %, as the $H_2SO_4$ content of etchant and the difference in potential between Al electrode and Ti electrode.

Figure 11:
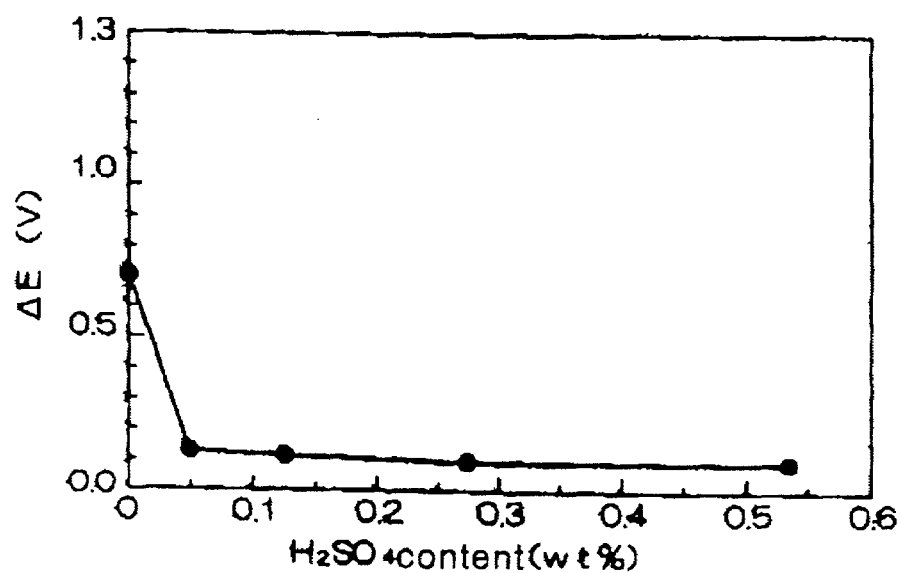
FIG. 11 is a graph showing the relation between the potential difference between an Al electrode and a Ti electrode, and the $H_2SO_4$ content of the etchant.
Figure 12:
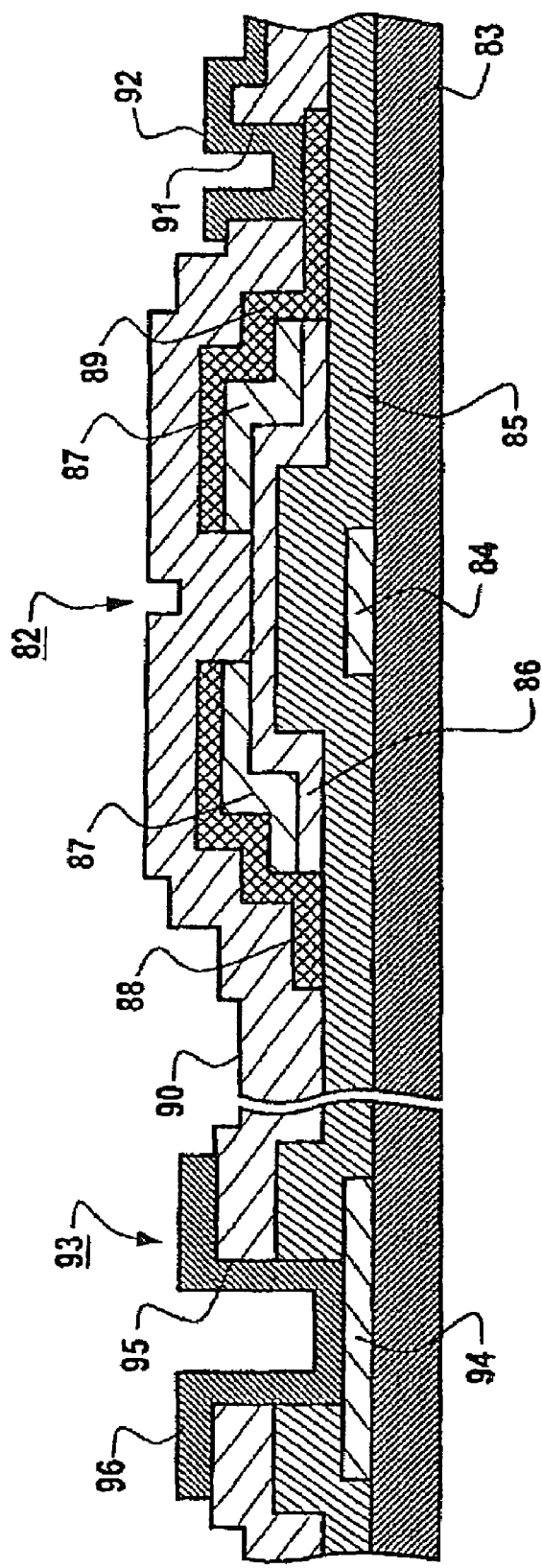
FIG. 12 is a plan view showing a part of the thin film transistor of a conventional thin film transistor LCD.
Figure 13:
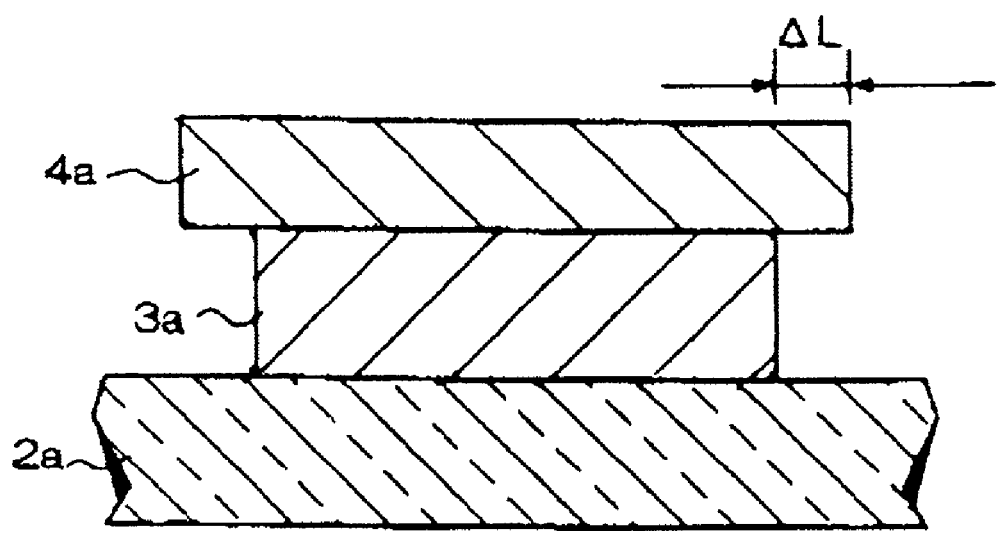
FIG. 13 is a sectional view showing a stacked layer of Al and Ti formed on a substrate.
Figure 14:
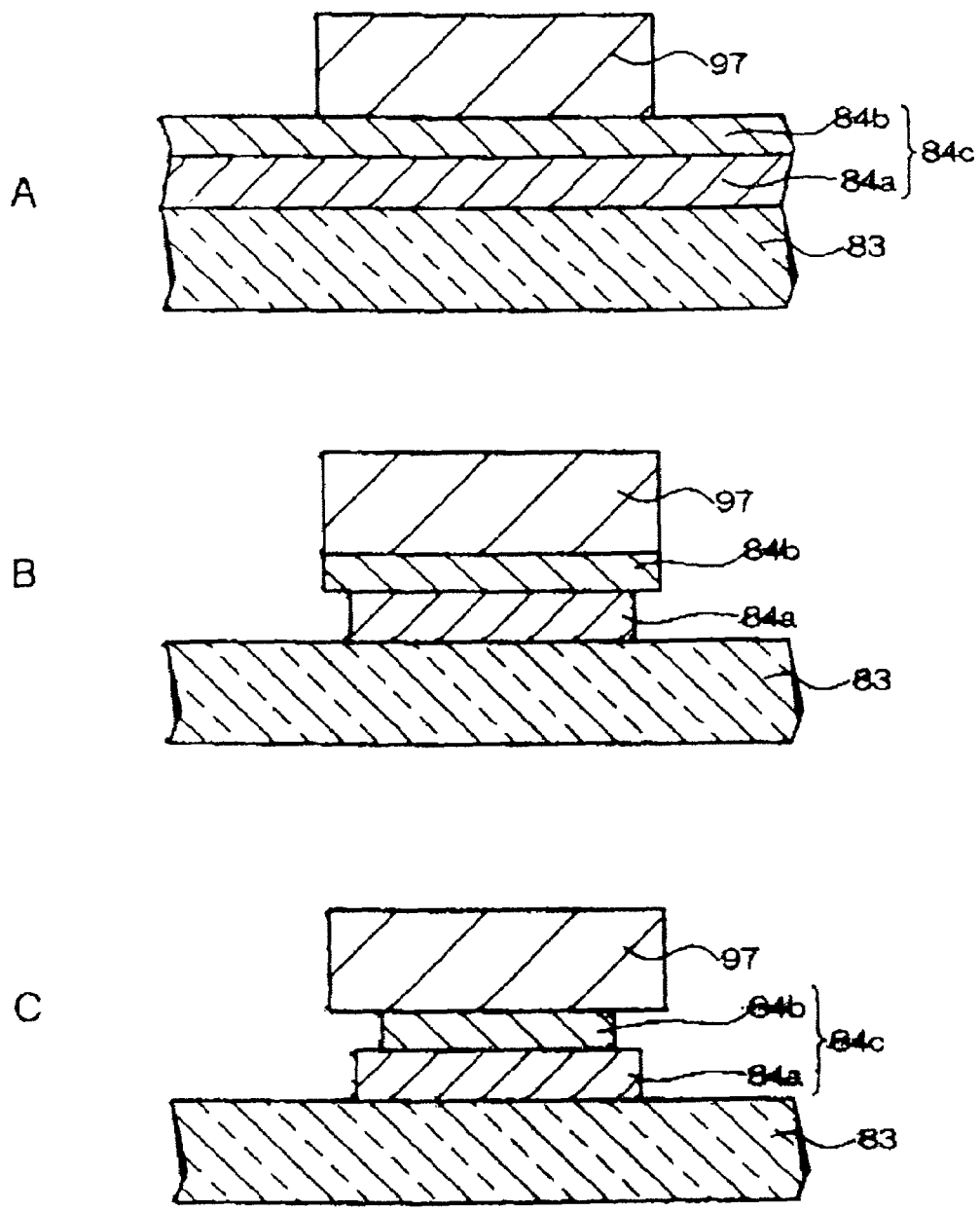
FIG. 14 is a plan view showing a method of manufacturing a substrate for an electronic device according to the prior art.
Figure 15:
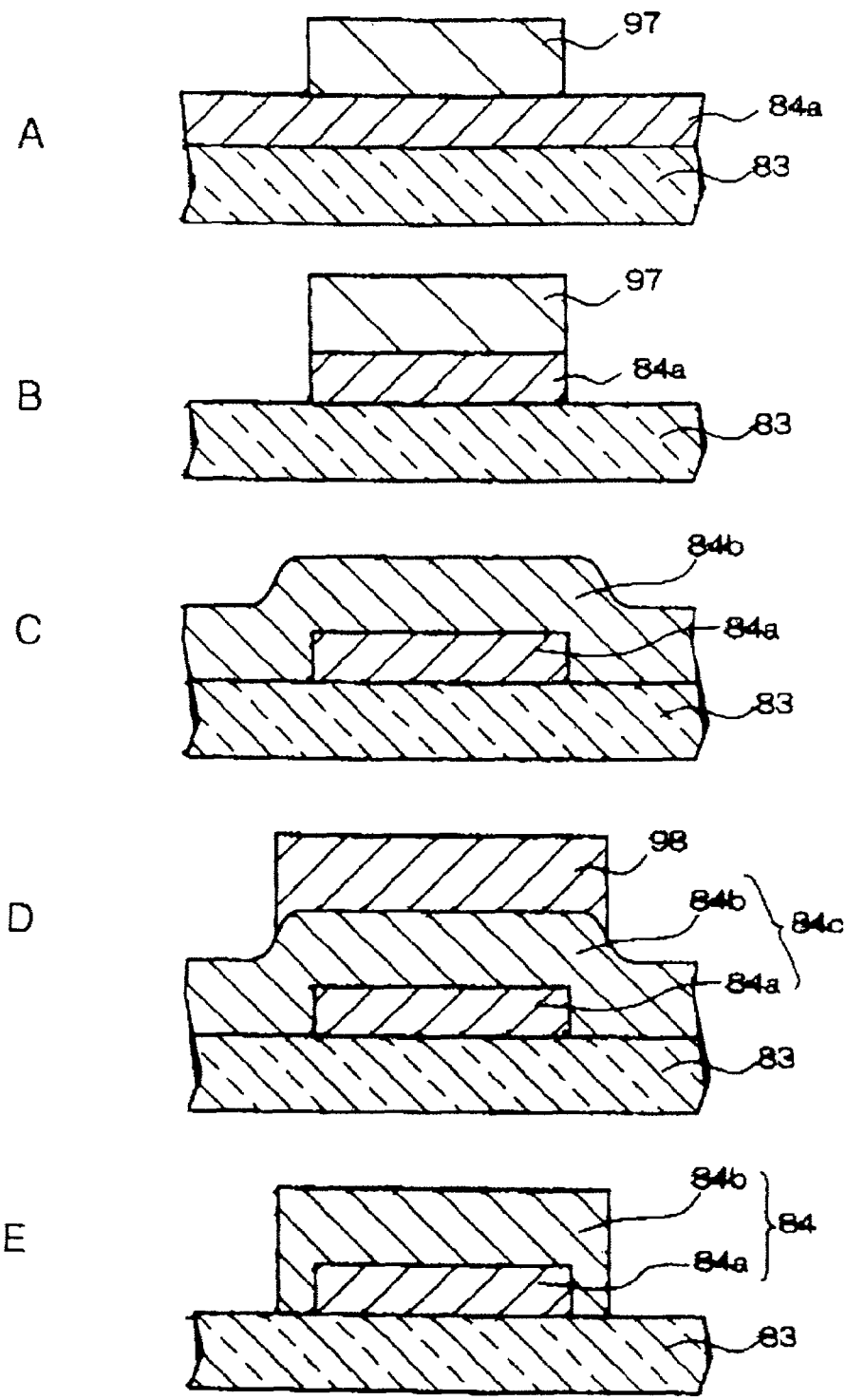
FIG. 15 is a plan view showing another method of manufacturing a substrate for an electronic device according to the prior art.

The result is shown in FIG. 11.

In the result shown in FIG. 11, in the case that the HF content of the etchant is 0.03 wt % and the $HIO_4$ content is 0.05 wt %, if $H_2SO_4$ were 0.05 wt % or less, the potential difference between the Al electrode and the Ti electrode ($\Delta E$) becomes 0.4V or less. Therefore the lower limit of the weight ratio of $H_2SO_4$ is 0.05 wt %.

As mentioned hereto, an etchant according to the present invention has the advantage that each metal layer composing a stacked layer of a Ti layer or Ti alloy layer as another metal layer accumulated on an Al layer or Al alloy layer having low resistance can be etched to a substantially equal etching rate by only etching the structure one time.

Also, according to a method of manufacturing a substrate for an electronic device of the present invention, if the stacked layer is etched by using the etchant of the structure, each metal layer composing the stacked layer could be etched to a substantially equal etching rate by only one time etching, so that it is easy to control the wiring width of the upper layer and the lower layer composing the stacked wiring layer, the yield is good and the manufacturing process cost can be reduced.

Also, according to an electronic device of the present invention, the voltage drop of a signal, caused by wiring resistance or wiring delay is not generated, and a most suitable display device of a wide-screen display, in which wiring is lengthened, or a high definition display, in which wiring becomes thin, can be easily realized.

What is claimed is:

1. A method for fabricating a display device having a plurality of pixels, comprising:

forming a first metal layer including aluminum on a substrate;

forming a second metal layer including titanium on the first metal layer; and wet-etching the first and second metal layers in a single etching step, wherein the wet-etched first and second metal layers are substantially free of a undercut, and wherein the wet-etching uses an etchant including a fluoric acid, a periodic acid and a sulfuric acid, in which the total weight ratio of the fluoric acid and the periodic acid is 0.05~30 wt %, the weight ratio of the sulfuric acid is 0.05~20 wt %, the weight ratio of the periodic acid to fluoric acid is 0.01~2 wt %.

2. The method according to claim 1, wherein an etching rate of the first metal layer is substantially equal to an etching rate of the second metal layer.

3. The method according to claim 1, wherein the wet-etched first and second metal layers are a metal layer of a thin film transistor.

4. The method according to claim 1, wherein the wet-etched first and second metal layers are used for a pad of the display device.

5. The method according to claim 1, wherein said wet-etching uses an etchant producing a first electric potential between the first metal layer and a standard hydrogen electrode and a second electric potential between the second metal layer and a standard hydrogen electrode, and the potential difference between the first electric potential and the second electric potential is less than 400 millivolts.

* * * * *